(12) United States Patent
Baggen et al.

(10) Patent No.: US 11,621,142 B2
(45) Date of Patent: Apr. 4, 2023

(54) SUBSTRATE POSITIONING DEVICE AND ELECTRON BEAM INSPECTION TOOL

(71) Applicant: ASML Netherlands B.V., Veldhoven (NL)

(72) Inventors: Marcel Koenraad Marie Baggen, Veldhoven (NL); Peter Paul Hempenius, Veldhoven (NL); Maarten Frans Janus Kremers, Veldhoven (NL); Robertus Jacobus Theodorus Van Kempen, Veldhoven (NL); Sven Antoin Johan Hol, San Jose, CA (US); Henricus Martinus Johannes Van De Groes, Veldhoven (NL); Johannes Hubertus Antonius Van De Rijdt, Veldhoven (NL); Niels Johannes Maria Bosch, Veldhoven (NL); Maarten Hartger Kimman, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 194 days.

(21) Appl. No.: 16/992,058

(22) Filed: Aug. 12, 2020

(65) Prior Publication Data

US 2020/0373118 A1 Nov. 26, 2020

Related U.S. Application Data

(63) Continuation of application No. PCT/EP2019/053214, filed on Feb. 8, 2019.

(30) Foreign Application Priority Data

Feb. 14, 2018 (EP) .................................... 18156626

(51) Int. Cl.
*H01J 37/20* (2006.01)
*H01J 37/28* (2006.01)
*H01L 21/66* (2006.01)

(52) U.S. Cl.
CPC .............. *H01J 37/20* (2013.01); *H01J 37/28* (2013.01); *H01L 22/12* (2013.01); *H01L 22/30* (2013.01);
(Continued)

(58) Field of Classification Search
CPC ......................... H01J 37/20; H01J 2237/20228
See application file for complete search history.

(56) References Cited

U.S. PATENT DOCUMENTS

| 6,175,169 B1 | 1/2001 | Hollis, Jr. et al. |
|---|---|---|
| 2005/0061626 A1 | 3/2005 | Hol et al. |

(Continued)

FOREIGN PATENT DOCUMENTS

| EP | 1 788 694 A1 | 5/2007 |
|---|---|---|
| EP | 2 819 146 A1 | 12/2014 |

(Continued)

OTHER PUBLICATIONS

International Search Report and International Written Opinion issued by the International Searching Authority in related PCT Application No. PCT/EP2019/053214, dated Apr. 12, 2019 (9 pgs.).

(Continued)

*Primary Examiner* — Eliza W Osenbaugh-Stewart
(74) *Attorney, Agent, or Firm* — Finnegan, Henderson, Farabow, Garrett & Dunner, LLP

(57) ABSTRACT

An electron beam apparatus is provided. The apparatus comprises an e-beam source configured to generate an electron beam, a first part configured to support a substrate, the first part comprising an object table for supporting the substrate, the first part further comprising a short stroke actuator system for actuating the object table relative to the e-beam source, the short stroke actuator system comprising a short stroke forcer. The apparatus further comprises a second part configured to movably support the first part and (Continued)

a long stroke actuator system configured to actuate movement of the first part with respect to the second part, the long stroke actuator system comprising a long stroke forcer, wherein the short stroke forcer and/or the long stroke forcer is configured to be switched off while the electron beam is projected onto the substrate.

14 Claims, 6 Drawing Sheets

(52) U.S. Cl.
CPC .............. *H01J 2237/20228* (2013.01); *H01J 2237/2813* (2013.01)

(56) References Cited

U.S. PATENT DOCUMENTS

| | | | |
|---|---|---|---|
| 2005/0248217 | A1 | 11/2005 | Cheung et al. |
| 2007/0041024 | A1* | 2/2007 | Gao .................. G01D 5/28 356/616 |
| 2013/0033122 | A1 | 2/2013 | Binnard |
| 2013/0162968 | A1 | 6/2013 | De Groot et al. |
| 2017/0307986 | A1 | 10/2017 | Ebert et al. |
| 2018/0088472 | A1* | 3/2018 | Shibazaki ........... G03F 7/70808 |

FOREIGN PATENT DOCUMENTS

| | | |
|---|---|---|
| TW | 201009519 A | 3/2010 |
| TW | 201732858 A | 9/2017 |
| WO | WO 97/19509 A1 | 5/1997 |
| WO | WO 2004/032212 A1 | 4/2004 |
| WO | WO 2009/083870 A3 | 7/2009 |
| WO | WO 2017/089214 A1 | 6/2017 |

OTHER PUBLICATIONS

Office Action of the Intellectual Property Office of Taiwan issued in related Taiwanese Patent Application No. 110101842; dated Dec. 28, 2021 (6 pgs.).

* cited by examiner

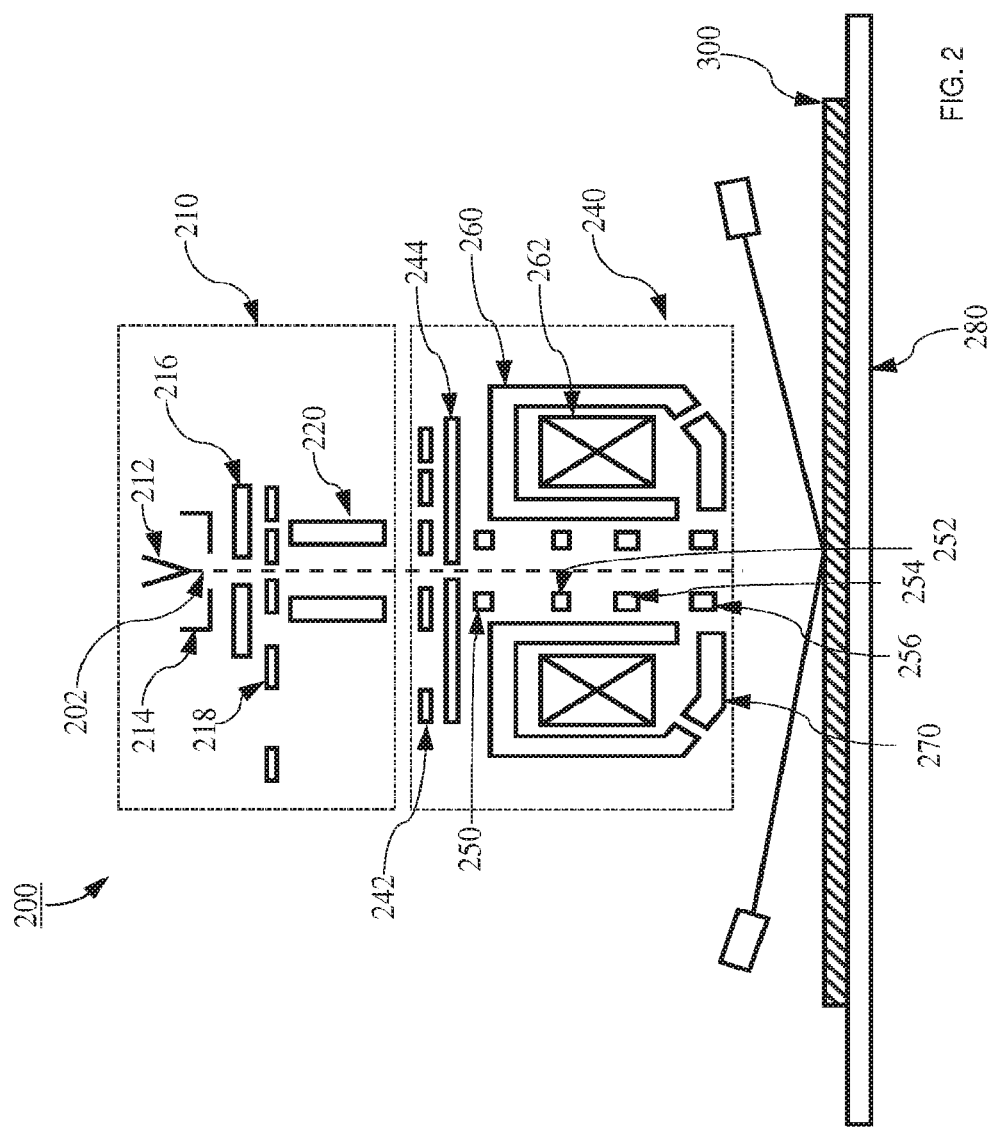

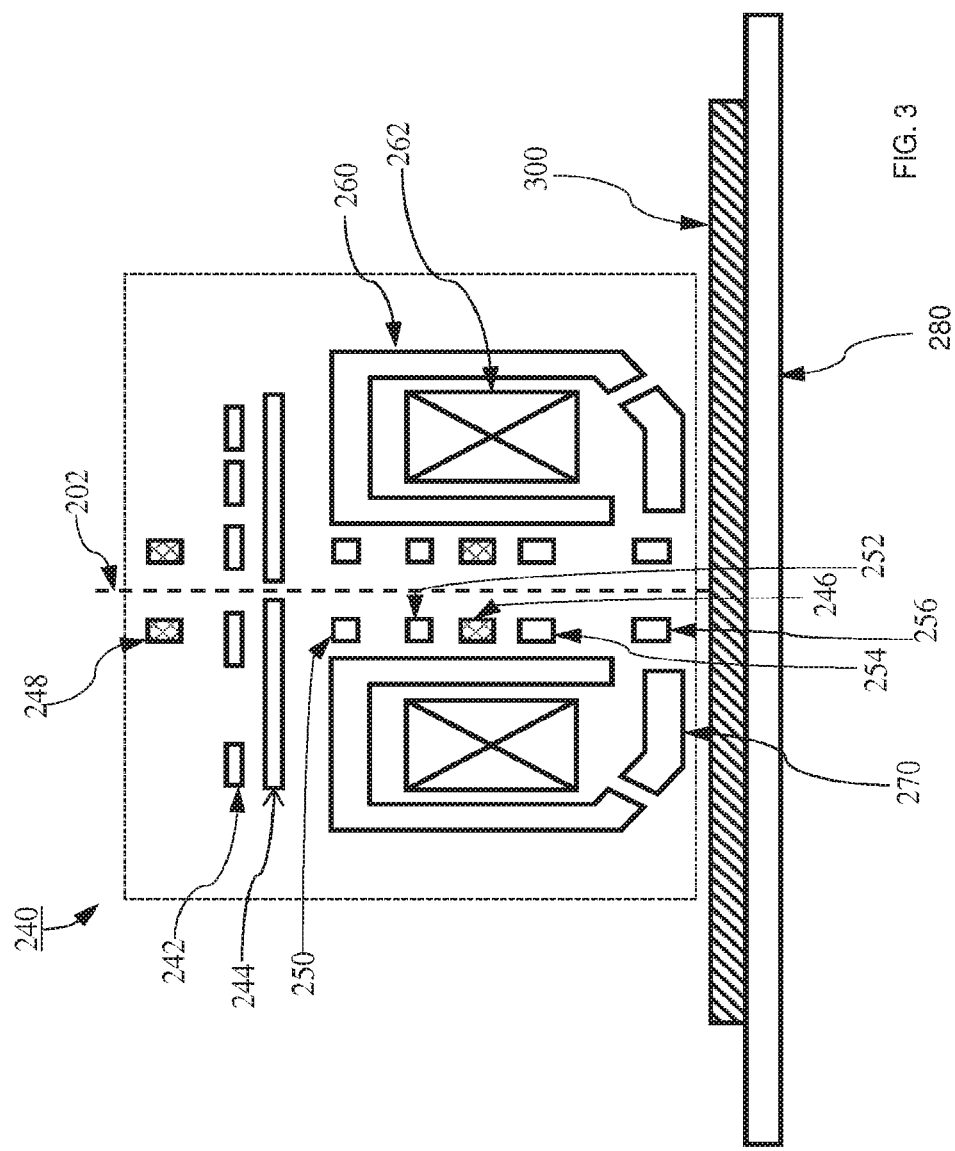

ated as WO 2019/158448 A1, which claims priority of EP
SUBSTRATE POSITIONING DEVICE AND ELECTRON BEAM INSPECTION TOOL

CROSS-REFERENCE TO RELATED APPLICATIONS

This application claims priority to International Application No. PCT/EP2019/053214, filed Feb. 8, 2019, and published as WO 2019/158448 A1, which claims priority of EP application 18156626.6 which was filed on Feb. 14, 2018. The contents of these applications are incorporated herein by reference in their entireties.

TECHNICAL FIELD

The present disclosure relates to a substrate positioning device, and an electron beam (e-beam) inspection tool comprising such substrate positioning device.

BACKGROUND

The present disclosure relates to an e-beam inspection tool as can be applied to inspect semiconductor devices.

In the semiconductor processes, defects are inevitably generated. Such defects may impact device performance even up to failure. Device yield may thus be impacted, resulting in increased costs. In order to control semiconductor process yield, defect monitoring is important. One tool useful in defect monitoring is an SEM (Scanning Electron Microscope) which scans a target portion of a specimen using one or more beams of electrons.

In a known embodiment of the e-beam inspection tool, a substrate positioning device is provided to support the substrate and to position the substrate in a desired set-point position, or at least close to this desired set-point position underneath the e-beam for measurements.

In this substrate positioning device, each actuator system comprises permanent magnet Lorentz actuators. The first actuator system and the second actuator system are typically provided for long stroke movements of the first part with respect to the second part. The first part supports a short stroke actuator system that allows to position the object table supporting the substrate in three degrees of freedom, i.e. the vertical direction and rotations about the first and second horizontal directions. This short stroke position system enables levelling of the substrate in the focal point of the inspection beam.

The inspection E-beam can be manipulated in the first and second horizontal direction by means of a deflection unit in the inspection tool with a range of about 2 µm. This functionality may be used for fine positioning of the inspection beam relative to the substrate. The measured position error of the substrate is used as input for the deflection unit controller.

Because of this functionality, the positioning accuracy requirements of the long stroke actuation system is limited. Nevertheless the long stroke actuation system based on permanent magnet Lorentz actuators has some drawbacks.

The long stroke actuation system has a position dependent compliance. This generates various vibrations due to the large excitation forces during set-point movement. Forces due to these vibrations are transported to the object table and to the frame that holds the E-beam source and determine the settling time of the system.

Furthermore, the magnetic field of the permanent magnets in the long-stroke actuator systems disturb the position of the measuring E-beam.

SUMMARY

This disclosure provides an alternative substrate positioning device that can be used in an e-beam inspection tool to position a substrate with respect to the e-beam. The substrate positioning device may be constructed to lack one or more of the above drawbacks of the substrate positioning device of known embodiments of the e-beam inspection tool, or at least to provide an alternative substrate positioning device.

According to some embodiments, there is provided an electron beam apparatus, comprising:
  an e-beam source configured to generate an electron beam;
  a first part configured to support a substrate, the first part comprising an object table for supporting the substrate, the first part further comprising a short stroke actuator system for actuating the object table relative to the e-beam source, the short stroke actuator system comprising a short stroke forcer;
  a second part configured to movably support the first part; and
  a long stroke actuator system configured to actuate movement of the first part with respect to the second part, the long stroke actuator system comprising a long stroke forcer,
  wherein the short stroke forcer and/or the long stroke forcer is configured to be switched off while the electron beam is projected onto the substrate.

According to some embodiments, there is provided an electron beam apparatus according to the aspect, wherein the electron beam apparatus comprises an scanning electron microscope, an E-beam direct writer, an E-beam projection lithography apparatus, an E-beam inspection apparatus, an E-beam defect verification apparatus, or an E-beam metrology apparatus.

BRIEF DESCRIPTION OF THE DRAWINGS

The present disclosure will be readily understood by the following detailed description in conjunction with the accompanying drawings, wherein like reference numerals designate like structural elements, and in which:

FIGS. 2 and 3 are schematic illustrations an electron optical system as can be applied in some embodiments of the present disclosure.

Figure 1A:
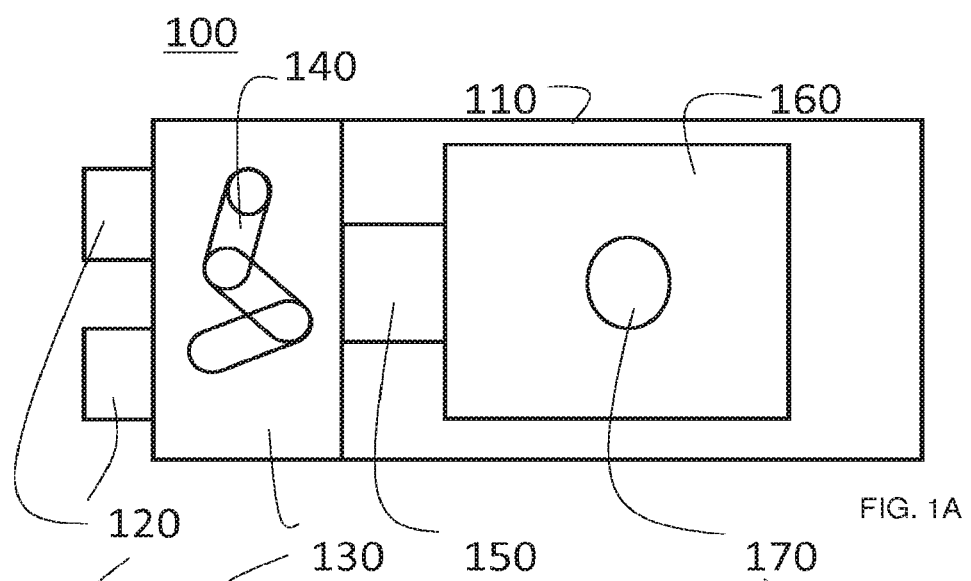
FIGS. 1A and 1B are schematic illustrations of an e-beam inspection tool according to some embodiments of the present disclosure.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit this disclosure to the particular form disclosed, but on the contrary, the disclosure is to cover all modifications, equivalents and alternatives falling within the spirit and scope of the present invention as defined by the appended claims.

DETAILED DESCRIPTION OF EXAMPLE EMBODIMENTS

Various example embodiments of the present disclosure will now be described more fully with reference to the accompanying drawings in which some example embodiments of the disclosure are shown. In the drawings, the thicknesses of layers and regions may be exaggerated for clarity.

Detailed illustrative embodiments of the present disclosure are disclosed herein. However, specific structural and functional details disclosed herein are merely representative for purposes of describing example embodiments of the present disclosure. The subject matter of this disclosure may, however, may be embodied in many alternate forms and should not be construed as limited to only the embodiments set forth herein.

Accordingly, while example embodiments of the disclosure are capable of various modifications and alternative forms, embodiments thereof are shown by way of example in the drawings and will herein be described in detail. It should be understood, however, that there is no intent to limit example embodiments of the disclosure to the particular forms disclosed, but on the contrary, example embodiments of the disclosure are to cover all modifications, equivalents, and alternatives falling within the scope of the disclosure. Like numbers refer to like elements throughout the description of the figures.

As used herein, the term "specimen" generally refers to a wafer or any other specimen on which defects of interest (DOI) may be located. Although the terms "specimen" and "sample" are used interchangeably herein, it is to be understood that embodiments described herein with respect to a wafer may configured and/or used for any other specimen (e.g., a reticle, mask, or photomask).

As used herein, the term "wafer" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities.

In this disclosure, "axial" means "in the optical axis direction of an apparatus, column or a device such as a lens", while "radial" means "in a direction perpendicular to the optical axis". Usually, the optical axis starts from the cathode and ends at specimen. The optical axis always refers to z-axis in all drawings.

The term, crossover, refers to a point where the electron beam is focused.

The term, virtual source, means the electron beam emitted from the cathode can be traced back to a "virtual" source.

The inspection tool according to the present disclosure relates to a charged particle source, especially to an e-beam source which can be applied to a SEM, an e-beam inspection tool, or an EBDW. The e-beam source, in this art, may also be referred to as an e-gun (Electron Gun).

With respect to the drawings, it is noted that the figures are not drawn to scale. In particular, the scale of some of the elements of the figures may be greatly exaggerated to emphasize characteristics of the elements. It is also noted that the figures are not drawn to the same scale. Elements shown in more than one figure that may be similarly configured have been indicated using the same reference numerals.

In the drawings, relative dimensions of each component and among every component may be exaggerated for clarity. Within the following description of the drawings the same or like reference numbers refer to the same or like components or entities, and only the differences with respect to the individual embodiments are described.

Accordingly, while example embodiments of the disclosure are capable of various modifications and alternative forms, embodiments thereof are shown by way of example in the drawings and will herein be described in detail. It should be understood, however, that there is no intent to limit example embodiments of the disclosure to the particular forms disclosed, but on the contrary, example embodiments of the disclosure are to cover all modifications, equivalents, and alternatives falling within the scope of the disclosure.

Figure 1B:
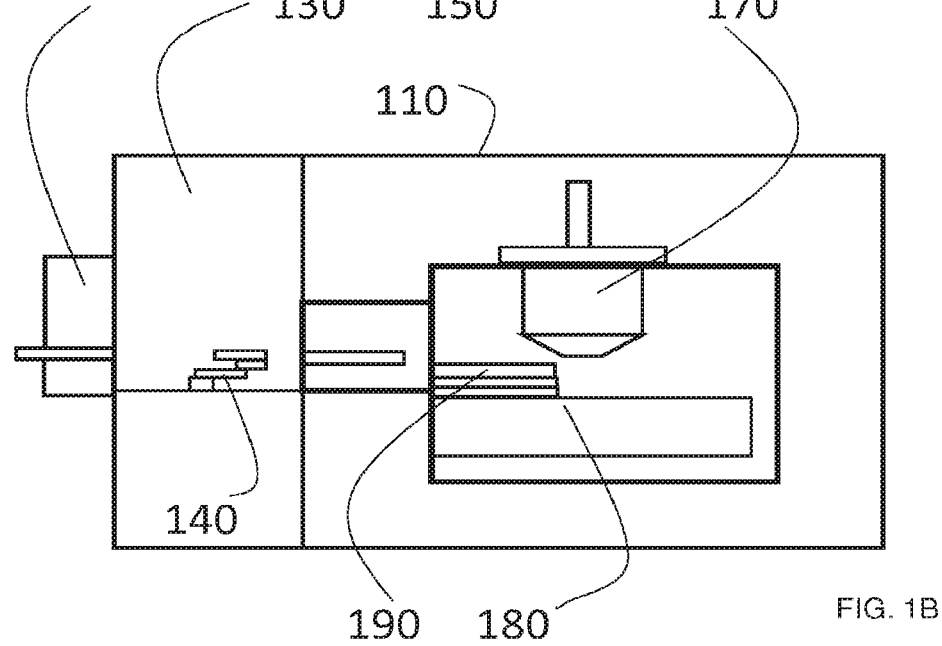

FIGS. 1A and 1B schematically depict a top view and a cross-sectional view of an electron beam (e-beam) inspection (EBI) system 100 according to some embodiments of the present disclosure. The embodiment as shown comprises an enclosure 110, a pair of load ports 120 serving as an interface to receive objects to be examined and to output objects that have been examined. The embodiment as shown further comprises an object transfer system, referred as an EFEM, equipment front end module 130, that is configured to handle and/or transport the objects to and from the load ports. In the embodiment as shown, the EFEM 130 comprises a handler robot 140 configured to transport objects between the load ports and a load lock 150 of the EBI system 100. The load lock 150 is an interface between atmospheric conditions occurring outside the enclosure 110 and in the EFEM and the vacuum conditions occurring in a vacuum chamber 160 of the EBI system 100. In the embodiment as shown, the vacuum chamber 160 comprises an electron optics system 170 configured to project an e-beam onto an object to be inspected, e.g. a semiconductor substrate or wafer. The EBI system 100 further comprises a positioning device 180 that is configured to displace the object 190 relative to the e-beam generated by the electron optics system 170.

In some embodiments, the e-beam inspection system 100 is operated in a leap-and-scan mode where the e-beam is projected, during the measurement, onto the object to be inspected while the positioning device 180 is substantially standstill when the object to be inspected is positioned at a desired set-point position, or at least close to that position, i.e. within the control range of the short stroke actuator system 184 and/or a deflection unit of the e-beam source. The positioning device 180 may perform a disturbance reduction operation to keep the position of the object to be inspected at the desired set-point position or close to that position during the measurement.

In some embodiments, the e-beam inspection system 100 is operated in a continuous scan mode where the e-beam is projected onto the object to be inspected while the positioning device 180 is actuating the object to be inspected. In the embodiments, the e-beam may be projected onto the object to be inspected when the object is moving at a substantially constant velocity.

In some embodiments, the positioning device may comprise a cascaded arrangement of multiple positioners such an XY-stage for positioning the object in a substantially horizontal plane, and a Z-stage for positioning the object in the vertical direction.

In some embodiments, the positioning device may comprise a combination of a coarse positioner, configured to provide a coarse positioning of the object over comparatively large distances and a fine positioner, configured to provide a fine positioning of the object over comparatively small distances.

In some embodiments, the positioning device 180 further comprises an object table for holding the object during the inspection process performed by the EBI system 100. In such embodiments, the object 190 may be clamped onto the object table by means of a clamp such as an electrostatic clamp. Such a clamp may be integrated in the object table.

In accordance with the present disclosure, the positioning device 180 comprises a first positioner for positioning the object table and a second positioner for positioning the first positioner and the object table. In addition, the positioning device 180 as applied in the e-beam inspection system 100 according to the present disclosure comprises a heating device that is configured to generate a heat load in the object table.

The positioning device 180 and heating device as applied in the present disclosure will be discussed in more detail below.

FIG. 2 schematically depict an embodiment of an electron optics system 200 as can be applied in e-beam inspection tool or system according to the present disclosure. The electron optics system 200 comprises an e-beam source, referred to as the electron gun 210 and an imaging system 240.

The electron gun 210 comprises an electron source 212, suppressor 214, an anode 216, a set of apertures 218, and a condenser 220. The electron source 212 can be a Schottky emitter. More specifically, the electron source 212 includes a ceramic substrate, two electrodes, a tungsten filament, and a tungsten pin. The two electrodes are fixed in parallel to the ceramic substrate, and the other sides of the two electrodes are respectively connected to two ends of the tungsten filament. The tungsten is slightly bended to form a tip for placing the tungsten pin. Next, a ZrO2 is coated on the surface of the tungsten pin, and is heated to 1300° C. so as to be melted and cover the tungsten pin but uncover the pinpoint of the tungsten pin. The melted ZrO2 can make the work function of the tungsten lowered and decrease the energy barrier of the emitted electron, and thus the electron beam 202 is emitted efficiently. Then, by applying negative electricity to the suppressor 214, the electron beam 202 is suppressed. Accordingly, the electron beam having the large spread angle is suppressed to the primary electron beam 202, and thus the brightness of the electron beam 202 is enhanced. By the positive charge of the anode 216, the electron beam 202 can be extracted, and then the Coulomb's compulsive force of the electron beam 202 may be controlled by using the tunable aperture 218 which has different aperture sizes for eliminating the unnecessary electron beam outside of the aperture. In order to condense the electron beam 202, the condenser 220 is applied to the electron beam 202, which also provides magnification. The condenser 220 shown in the FIG. 2 may e.g. be an electrostatic lens which can condense the electron beam 202. On the other hand, the condenser 220 can be also a magnetic lens.

The imaging system 240 as shown in FIG. 3 comprises a blanker 248, a set of apertures 242, a detector 244, four sets of deflectors 250, 252, 254, and 256, a pair of coils 262, a yoke 260, a filter 246, and an electrode 270. The electrode 270 is used to retard and deflect the electron beam 202, and further has electrostatic lens function due to the combination of upper pole piece and sample 300. Besides, the coil 262 and the yoke 260 are configured to the magnetic objective lens.

The electron beam 202, described above, is generated by heating the electron pin and applying the electric field to anode 216, so that, in order to stabilize the electron beam 202, there must be a long time for heating the electron pin. For a user end, it is surely time consuming and inconvenient. Hence, the blanker 248 is applied to the condensed electron beam 202 for temporally deflecting the electron beam 202 away from the sample rather than turning off it.

The deflectors 250 and 256 are applied to scan the electron beam 202 to a large field of view, and the deflectors 252 and 254 are used for scanning the electron beam 202 to a small field of view. All the deflectors 250, 252, 254, and 256 can control the scanning direction of the electron beam 202. The deflectors 250, 252, 254, and 256 can be electrostatic deflectors or magnetic deflectors. The opening of the yoke 260 is faced to the sample 300, which immerses the magnetic field into the sample 300. On the other hand, the electrode 270 is placed beneath the opening of the yoke 260, and therefore the sample 300 will not be damaged. In order to correct the chromatic aberration of the electron beam 202, the retarder 270, the sample 300, and the upper pole piece form a lens to eliminate the chromatic aberration of the electron beam 202.

Besides, when the electron beam 202 bombards into the sample 300, a secondary electron will be emanated from the surface of the sample 300. Next the secondary electron is directed to the detector 244 by the filter 246.

Figure 4:
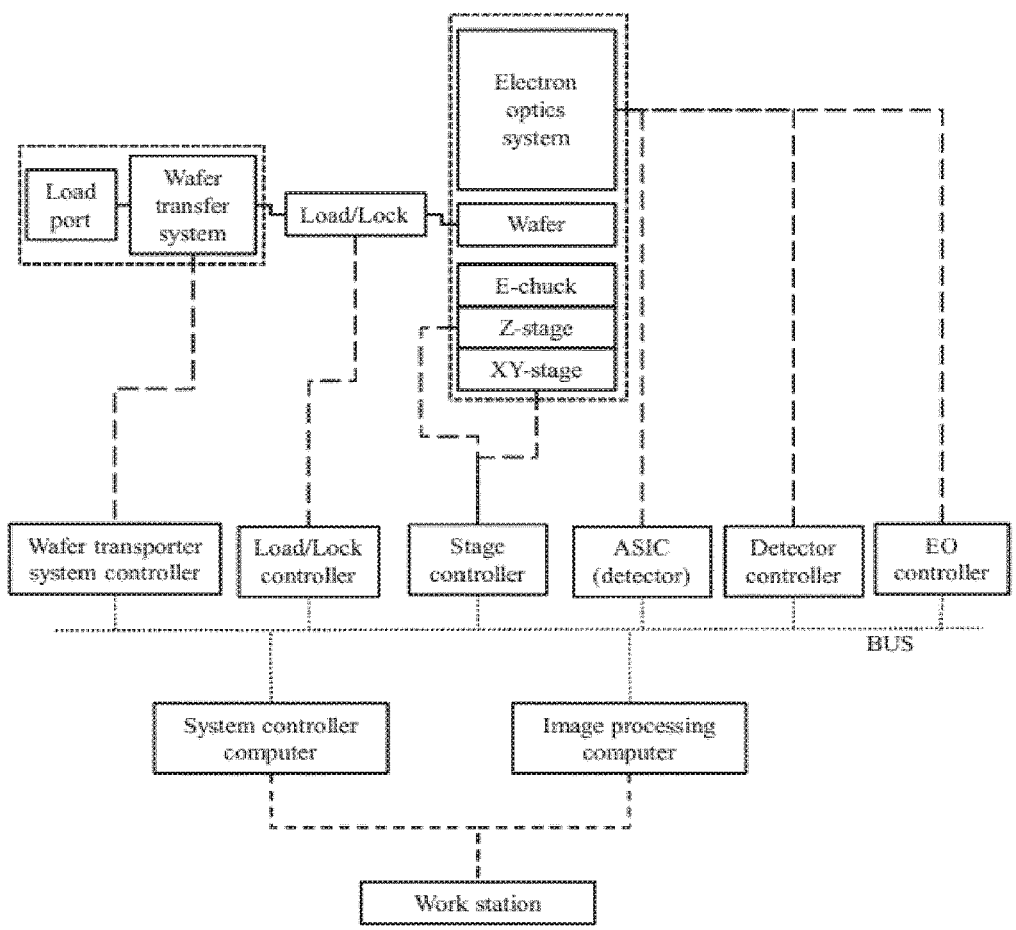
FIG. 4 schematically depicts a possible control architecture of an EBI system according to the present disclosure.

FIG. 4 schematically depicts a possible control architecture of an EBI system according to the present disclosure. As indicated in FIG. 1, the EBI system comprises a load lock, a wafer transfer system, a load/lock, an electron optics system and a positioning device, e.g. including a z-stage and an x-y stage. As illustrated, these various components of the EBI system may be equipped with respective controllers, i.e., a wafer transporter system controller connected to the wafer transfer system, a load/lock controller, an electron optics controller, a detector controller, a stage controller. These controllers may e.g. be communicatively connected to a system controller computer and an image processing computer, e.g. via a communication bus. In the embodiment as shown, the system controller computer and the image processing computer may be connected to a workstation.

The load port loads a wafer to the wafer transfer system, such as EFEM 130, and the wafer transfer system controller controls the wafer transfer to transfer the wafer to the load/lock, such as load lock 150. The load/lock controller controls the load/lock to the chamber, such that an object that is to be examiner, e.g. a wafer can be fixed on a clamp, e.g. an electrostatic clamp, also referred to as an e-chuck. The positioning device, e.g. the z-stage and the x-y stage, enable the wafer to move by the stage controller. In some embodiments, a height of the z-stage may e.g. be adjusted using a piezo component such as a piezo actuator. The electron optic controller may control all the conditions of the electron optics system, and the detector controller may receive and convert the electric signals from the electron optic system to image signals. The system controller computer is to send the commands to the corresponding controller. After receiving the image signals, the image processing computer may process the image signals to identify defects.

Figure 5:
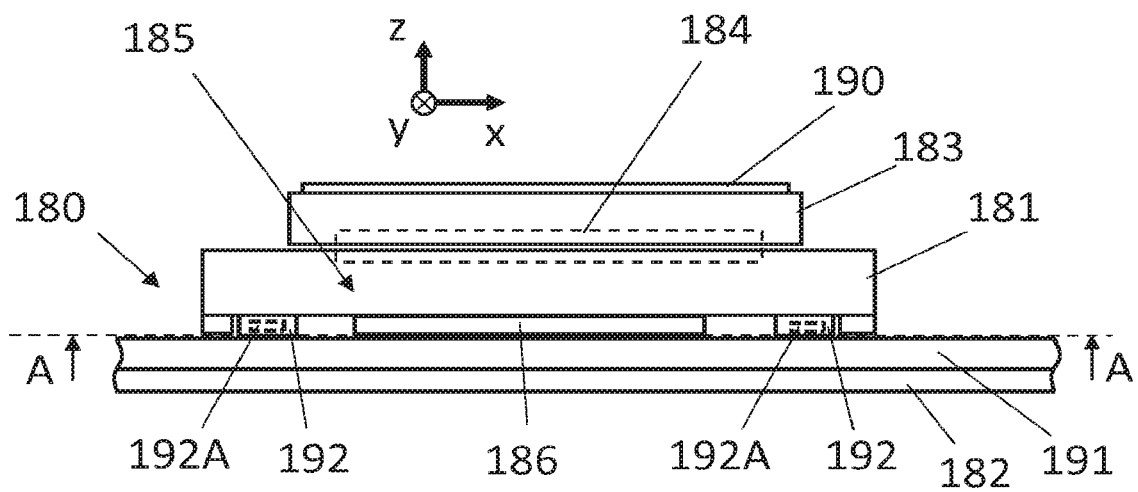
FIG. 5 schematically depicts a side view on some embodiments of a positioning device to be applied in the e-beam inspection tool according to the disclosure.

FIG. 5 schematically depicts an embodiment of a substrate positioning device 180 for an e-beam inspection tool 1 according to some embodiments of the present disclosure.

The substrate positioning device 180 comprises a first part 181 and a second part 182 which is movable, at least in the horizontal plane, with respect to the first part 181. The first part 181 comprises an object table 183 to support the object 190, in particular a substrate, and a short stroke actuator system 184 comprising short stroke forcers for fine positioning of the object table 183. The short stroke actuator system 184 may comprises passive bearings and/or non-magnetic bearings.

A planar actuator system 185, also referred to as a long stroke actuator system, is provided to actuate movement of the first part 181 with respect to the second part 182 in the horizontal plane, i.e. movement in the perpendicular horizontal directions (x, y) and rotation about the vertical axis (Rz).

The planar actuation system 185 comprises a number of actuators to actuate the movement of the first part 181 with respect to the second part 182.

Figure 6:
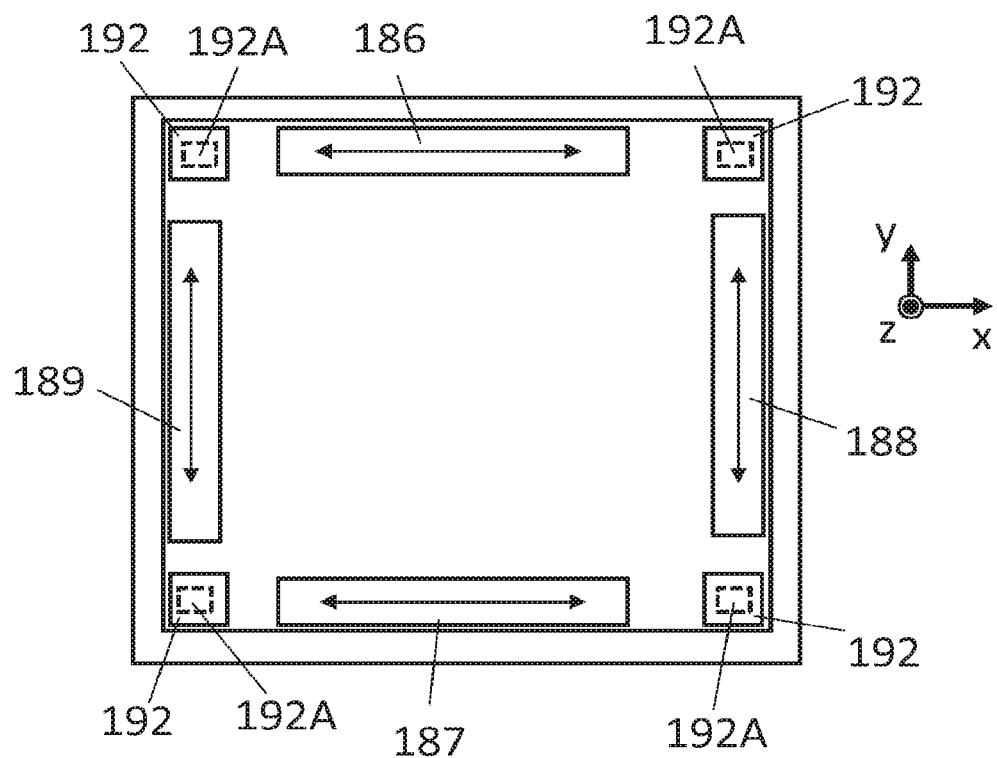
FIG. 6 schematically depicts the bottom view B-B of a part of the embodiment of FIG. 5.

FIG. 6 shows a bottom view of the first part 181 from the line A-A (indicated in FIG. 5). FIG. 6 shows a first forcer 186 of a first actuator and a second forcer 187 of a second actuator to actuate the first part 181 in the horizontal x-direction, and a third forcer 188 of a third actuator and a fourth forcer 189 of a fourth actuator to actuate the first part 181 in the horizontal y-direction. The forcers of the long stroke actuator system are also referred to as long stroke forcers.

All four forcers 186, 187, 188 and 189 cooperate with a common stator 191 of the second part 182 in order to exert a force in the respective horizontal direction.

To support the first part 181 in the vertical direction, i.e. z-direction, four passive bearings 192 are provided. These passive bearings 192 do not actively control the position of the first part 181 with respect to the second part 182, but provide vertical support to hold the first part 181. This means that when the actuator system 185 fails or is shut down, the first part 181 remains to be supported by the passive bearings 192 and does not fall down on the second part 182. As a result, no separate system to prevent or guide falling down of the first part 181 has to be provided. The passive bearings may be non-magnetic bearings.

In some embodiments, the passive bearings 192 are mechanical support feet that provide support by mechanical contact between the passive bearings 192 and the second part 182. Wear of the mechanical support feet due to sliding of the mechanical support feet over the surface of the second part 182 may be minimized by selecting proper material combination of the mechanical support feet and the top surface of the common stator 191, and lubrication of the mechanical contact area between the mechanical support feet and the top surface of the common stator 191.

The common stator 191 may for example be an aluminum block or plate having a horizontal top surface which may act as a bearing surface for the passive bearings 192 and as an actuator interface for each of the forcers 186, 187, 188 and 189.

A preload of the passive bearings 192 may be required to ensure that the first part 181 does not slide with respect to the second part 182 without being actuated for such movement. This preload may be realized with gravity load and additional preload created by a force actuation system 192A arranged to exert a preload force between the first part and the second part in the vertical direction. The force actuation system 192A may for example comprise electro-magnets in the mechanical support feet that exert a pulling force the common stator 191 or a body of the second part 182 beneath the common stator 191. Alternatively or in addition, the passive bearings 192 may be roller bearings.

In an alternative embodiment, the passive bearings 192 may be gas bearings, for example air bearings, to provide a high vertical stiffness and damping without direct mechanical contact between the passive bearings 192 and the second part 182. The required preload may for example be obtained by creating a vacuum to pull the first part 181 on the top surface of the stator 191.

The mechanical support feet have the advantage that they also can be used in a conditioned space with reduced pressure, i.e. a vacuum space. In such space air bearings cannot be applied. The advantage of the air bearings is that there is no direct mechanical contact between the passive bearings 192 and the common stator 191 preventing wear of the passive bearings 192.

The preload may also be realized by any other force actuation system 192A to exert a preload force between the first part and the second part in the vertical direction. The force actuation system 192A may be provided in or on the first part 181, in particular the passive bearings 192 and/or the second part 182, in particular the stator 191.

In some embodiments, the forcers 186, 187, 188 and 189 of the actuators are induction-type motors. In an induction-type motor, the forcers 186, 187, 188 and 189 are arranged to generate a magnetic field that moves over the common electrical stator 191 where eddy current forces are generated. These stator eddy currents in combination with the magnetic field generated by the forcers 186, 187, 188 and 189 generate a relative force between the forcers 186, 187, 188 and 189 and the stator 191. In the planar configuration of the planar actuator system 185, the force direction of each of the forcers 186, 187, 188 and 189 is only determined by the orientation of the respective forcer 186, 187, 188, 189. In the embodiment of FIG. 5, the first forcer 186 and the second forcer 187 will generate a force in the horizontal x-direction, while the third forcer 188 and the fourth forcer 189 will generate a force in the horizontal y-direction. It will be clear that a rotation of the first part 181 about the vertical axis Rz can be created by actuation of one or more of the four actuators.

The actuated force in an induction-type motor depends on the relative speed between the magnetic field generated by the respective forcer 186, 187, 188, 189 and the stator 191, and the current of the respective forcer 186, 187, 188, 189. The stator 191 to be used in combination with the induction-type motors may be continuous, i.e. without teeth or other patterns, and as a result has no position dependent forces.

This positioning device 180 has a low mechanical complexity, and can easily and reliably be controlled. Furthermore, there is no risk of falling down of the first part 181 in case the planar actuation system 185 fails, since the passive bearings 192 prevent falling down of the first part 181.

Another advantage of this positioning device 180 is that the planar actuator system 185 is free of permanent magnets, i.e. the induction-type motors do not use permanent magnets as used in Lorentz type motors. This also allows another control method to advantageously control the position of the object table 183. In this control method, the forcers 186, 187, 188 and 189 are actuated to position the object table 183 in a desired set-point position (x, y, Rz), or at least close to that position, i.e. within the control range of the short stroke actuator system 184 and/or a deflection unit of the e-beam source. Once the object table 183 is arranged in this position, the forcer current of all forcers 186, 187, 188 and 189 may be switched off. As a result, there is no longer any magnetic field generated by one of the forcers 186, 187, 188 and 189.

The control range may be 1000 μm, 100 μm, 10 μm, 1000 nm, 100 nm, 10 nm, 1 nm or smaller.

The high horizontal and vertical stiffness of the passive bearings 192 guarantees that the position of the first part 181 is stable and properly damped, which results in a low settling time. Since there is no permanent magnet in the planar actuator system 185, the planar actuator system 185 does not create any magnetic field, once the forcers 186, 187, 188 and 189 are switched off, that can negatively influence the measurements with the e-beam of the e-beam source.

Furthermore, any small positioning error in the position of the object table 183 can be corrected by the short stroke actuator system 184, or, as an alternative or in addition, such positioning error may be compensated by a deflection unit of the e-beam source.

The e-beam inspection tool may further comprises one or more further forcers to compensate for dynamical disturbance effects during measurement with the e-beam.

During measurements the stator 191 may be mechanically fixed to first part 181. Therefore, possible vibrations of the stator 191 during measurements should be minimized. This can for example be realized by a compliant support of the stator 191 in combination with a frame motion compensation system between a support, for example a support floor, and the stator 191, or, as an alternative, a relatively stiff connection between the stator 191 and the e-beam electron optics system 200 may be provided. The compliant support of the stator 191 in combination with a frame motion compensation system enables dynamic isolation of the electron optics system 200 against movements of the first part 181. Therefore it is desirable that isolation of any dynamical disturbance should be realized with a metroframe which is isolated from external dynamical disturbances.

Another advantage of the induction-type motors is that the forcers 186, 187, 188 and 189 do not require commutation position input. This means that there is no requirement to provide an accurate commutation measurement system and commutation alignment during initialization of the positioning device 180.

To avoid that the common stator 191 will become overheated, a cooling device may be provided in the stator 191.

Induction-type motors may also be applied in the short stroke actuator system 184 to position the object table 183 with high accuracy with respect to the e-beam. Furthermore, the short stroke actuator system may be free of permanent magnet when an induction-type motor is used.

In an alternative embodiment of the planar actuation system 185, the forcers 186, 187, 188 and 189 of the actuators of the planar actuation system 185 may be reluctance-type motors. The advantage of reluctance-type motors, similar to the induction-type motors, is that they do not comprise permanent magnets. As a result, they will only generate a magnetic field when activated. This means that in a position control method as described above, in which the first part 181 is brought into or close by a desired position and then no longer activated but supported on the passive bearings 192, the planar actuation system no longer generates a magnetic field that can negatively influence the e-beam of the e-beam source during e-beam measurements.

A reluctance-type motor, in particular its forcer, may be of relatively light and compact design, which is advantageous for integrating the forcers into the first part 181 of the positioning device 180.

A stator 191 of a reluctance motor may require cooling. A cooling device may for this reason be provided in the stator 191. However, no active cooling may be required in the forcers 186, 187, 188 and 189, and as a result no cooling connection has to be made to the movable first part 181, such as a cooling water hose.

Reluctance-type motors may also be applied in the short stroke actuator system 184 to position the object table 183 with high accuracy with respect to the e-beam. The short stroke actuator system may be free of permanent magnet when a reluctance-type motor is used.

Figure 7:
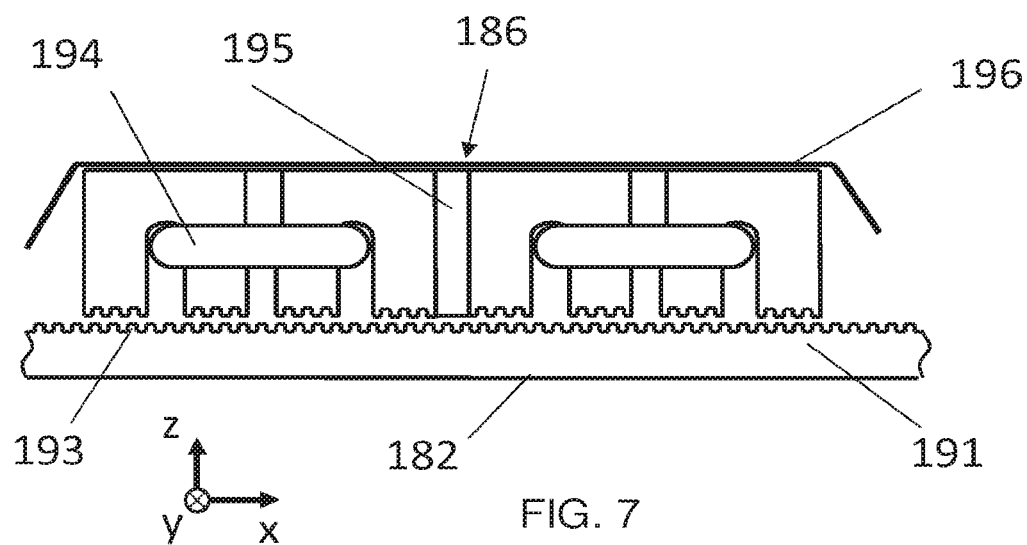
FIG. 7 schematically depicts an sawyer-type actuator.

In yet an alternative embodiment of the planar actuation system 185, the forcers 186, 187, 188 and 189 of the actuators of the planar actuation system 185 may be sawyer-type motors. An example of such sawyer-type motor (forcer 186) is shown in FIG. 7. The other forcers 187, 188, 189 may be constructed correspondingly. The sawyer-type motor may also be constructed with other, alternative coil configurations.

The stator 191 comprises an array of ferromagnetic poles 193. The forcer 186 comprises a two-phase coil system 194 and a permanent magnet 195. An advantage of such construction is that the permanent magnet 195 is arranged in the forcer 186 at a lower area of the planar actuation system 185. The permanent magnet 195 can therefor effectively magnetically be shielded by a shielding device 196 to prevent that the magnetic field of the permanent magnet 195 negatively influences the e-beam of the e-source in a e-beam inspection tool.

In addition or alternatively, a magnetic shield may be arranged in the first part and/or the second part to prevent that the magnetic field of the permanent magnet 195 negatively influences the e-beam generated by the e-beam source in the e-beam inspection tool. The magnetic shield may be arranged in the short stroke actuator system and/or the long stroke actuator system.

When applying a block-shaped current to the two-phase coil system 194, a step will be made by the forcer 186 with respect to the stator 191 in the actuation direction of the forcer 186. Such step has a distance of lambda/4, where lambda equals the stator tooth pitch. By continuously applying the block-shaped current to the two-phase coil system 194, the forcer 186 can be moved along the stator 191 with these steps.

When using a block-shaped current to apply to the two-phase coil system 194, the forcer cannot be positioned in an intermediate position between the step positions. However, when applying sinusoidal currents to the two-phase coil system 194, a controllable force can be provided by the forcer 186 that allows positioning of the forcer in any desired intermediate position.

The planar actuation system 185 based on forcers of the sawyer-type, provides a suitable planar configuration in which the forcers 186, 187, 188, 189 allow movement over a longer distance. At the same time, the forcers 186, 187, 188, 189 can be provided in a compact and light design, whereby the permanent magnet 195 in each of the forcers 186, 187, 188, 189 can be effectively magnetically shielded by a shielding device 196 that prevents that the e-beam is negatively influenced by the magnetic field of the permanent magnet 195.

Figure 8:
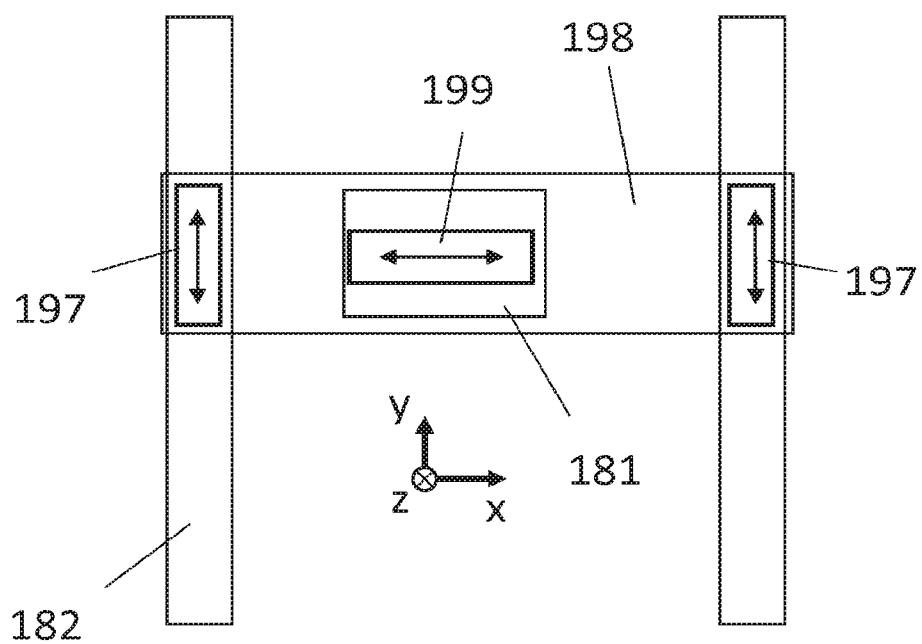
FIG. 8 schematically depicts an H-shaped actuator configuration with sawyer-type actuators.

The forcers based on the sawyer-type may also be applied in other drive configurations than the planar configuration of FIG. 5. FIG. 8 shows a H-configuration with sawyer-type motors. In this H-configuration two sawyer-type motors 197 are provided to move a cross beam 198 in y-direction with respect to the second part 182 of the positioning device. On the cross beam 198 a further sawyer-type motor 199 is provided to move the first part 181 in the x-direction.

By controlling the two sawyer-type motors 197 for movement in the y-direction and the further sawyer-type motor 199 for movement in the x-direction the first part 181, in particular an object table supported thereon, may be arranged in any desirable position in the horizontal plane.

Also in this H-configuration, only permanent magnets are provided in the two sawyer-type motors 197 and the further sawyer-type motor 199. These permanent magnets can effectively be shielded by a shielding device 196, as shown in FIG. 7.

In alternative embodiments, the permanent magnet 195 of the Sawyer-type forcers may be replaced by a direct current (DC) coil. In such embodiments, all the magnetic field sources of the forcers can be switched off during measurement, thus possibly eliminating the requirement of magnetic shielding as applied in the sawyer-type forcers shown in FIGS. 7 and 8. Such motor may be referred to as a sawyer type motor having a direct current (DC) coil, or as an alternative, as a parallel flux switching machine or a Vernier hybrid machine.

Further embodiments may be described in the following clauses:

1. An electron beam apparatus, comprising:
   an e-beam source configured to generate an electron beam;
   a first part configured to support a substrate, the first part comprising an object table for supporting the substrate, the first part further comprising a short stroke actuator system for actuating the object table relative to the e-beam source, the short stroke actuator system comprising a short stroke forcer;
   a second part configured to movably support the first part; and
   a long stroke actuator system configured to actuate movement of the first part with respect to the second part, the long stroke actuator system comprising a long stroke forcer, wherein the short stroke forcer and/or the long stroke forcer is configured to be switched off while the electron beam is projected onto the substrate.
2. An electron beam apparatus according to clause 1, wherein the short stroke forcer and/or the long stroke forcer is configured to be switched off when the object table is positioned within a range from a desired position.
3. An electron beam apparatus according to clause 2 further comprising a deflection unit configured to deflect the electron beam, wherein the range is substantially equal to or smaller than a control range of the short stroke actuator system, a further control range of the deflection unit, or an even further control range being a sum of the control range and the further control range.
4. An electron beam apparatus according to any preceding clauses, wherein the electron beam apparatus is configured to operate in leap-and-scan mode or in continuous scan mode.
5. An electron beam apparatus according to any preceding clauses, wherein the range is 1000 μm, 100 μm, 10 μm, 1000 nm, 100 nm, or smaller.
6. An electron beam apparatus according to any preceding clauses, wherein the object table is actuated at a velocity of 0.01 m/s, 0.05 m/s, 0.1 m/s, 0.5 m/s, 1.0 m/s, 5 m/s or higher.
7. An electron beam apparatus according to any preceding clauses, wherein the object table is actuated by an acceleration of 1 m/s^2, 5 m/s^2, 10 m/s^2, 50 m/s^2, 100 m/s^2 or higher.
8. An electron beam apparatus according to any preceding clauses, wherein the object table is actuated with a precision of 10 μm, 1000 nm, 100 nm, 10 nm, 1 nm, 0.1 nm or better.
9. An electron beam apparatus according to any preceding clauses, wherein the short stroke actuator system and/or the long stroke actuator system is free of permanent magnet.
10. An electron beam apparatus according to any preceding clauses, wherein the short stroke actuator system and/or the long stroke actuator system comprises an induction motor and/or a reluctance motor.
11. An electron beam apparatus according to any of clause 1 to 8 or clause 10, wherein the short stroke actuator system and/or the long stroke actuator system comprises a sawyer type motor.
12. An electron beam apparatus according to any preceding clauses, wherein the first part and/or the second part comprises a magnetic shield.
13. An electron beam apparatus according to any preceding clauses, wherein the short stroke actuator system and/or the long stroke actuator system comprises a magnetic shield.
14. An electron beam apparatus according to any preceding clauses, wherein the short stroke actuator system is configured to actuate the object table in three degrees of freedom or higher, and/or wherein the long stroke actuator system is configured to actuate the first part in two degrees of freedom or higher.
15. An electron beam apparatus according to any preceding clauses, wherein the short stroke actuator system and/or the long stroke actuator system further comprising a non-magnetic bearing.
16. An electron beam apparatus according to clause 15, wherein the non-magnetic bearing is a passive bearing comprising a roller baring, a mechanical support foot or a gas bearing.
17. An electron beam apparatus according to any preceding clauses, wherein the electron beam apparatus comprises an scanning electron microscope, an E-beam direct writer, an E-beam projection lithography apparatus, an E-beam inspection apparatus, an E-beam defect verification apparatus, or an E-beam metrology apparatus.
18. A method of operating an electron beam apparatus, the method comprising:
   actuating, by an long stroke actuator system, movement of a first part relative to a second part, the first part configured to support a substrate, the first part comprising an object table for supporting the substrate, the first part further comprising a short stroke actuator system for actuating the object table relative to an e-beam source of the e-beam apparatus, the short stroke actuator system comprising a short stroke forcer, the e-beam source configured to generate an electron beam, the second part configured to movably support the first part, the long stroke actuator system comprising a long stroke forcer;
   and subsequently switching off the short stroke forcer and/or the long stroke forcer while the electron beam is projected onto the substrate.
19. A method of operating an electron beam apparatus according to clause 18, wherein the short stroke forcer and/or the long stroke forcer is configured to be switched off when the object table is positioned within a range from a desired position.

20. A method of operating an electron beam apparatus according to clause 19, wherein the electron beam apparatus further comprising a deflection unit configured to deflect the electron beam, and wherein the range is substantially equal to or smaller than a control range of the short stroke actuator system, a further control range of the deflection unit, or an even further control range being a sum of the control range and the further control range.

21. A method of operating an electron beam apparatus according to any of clause 18 to 20, wherein the electron beam apparatus is operated in leap-and-scan mode or in continuous scan mode.

22. A method of operating an electron beam apparatus according to any of clause 18 to 21, wherein the range is 1000 µm, 100 µm, 10 µm, 1000 nm, 100 nm, 10 nm, 1 nm or smaller.

23. A method of operating an electron beam apparatus according to any of clause 18 to 22, wherein the object table is actuated at a velocity of 0.01 m/s, 0.05 m/s, 0.1 m/s, 0.5 m/s, 1.0 m/s, 5 m/s or higher.

24. A method of operating an electron beam apparatus according to any of clause 18 to 23, wherein the object table is actuated by an acceleration of 1 m/s^2, 5 m/s^2, 10 m/s^2, 50 m/s^2, 100 m/s^2 or higher.

25. A method of operating an electron beam apparatus according to any of clause 18 to 24, wherein the object table is actuated with a precision of 10 µm, 1000 nm, 100 nm, 10 nm, 1 nm, 0.1 nm or better.

26. A method of operating an electron beam apparatus according to any of clause 18 to 25, wherein the short stroke actuator system and/or the long stroke actuator system is free of permanent magnet.

27. A method of operating an electron beam apparatus according to any of clause 18 to 26, wherein the short stroke actuator system and/or the long stroke actuator system comprises an induction motor and/or a reluctance motor.

28. A method of operating an electron beam apparatus according to any of clause 18 to 25 or clause 27, wherein the short stroke actuator system and/or the long stroke actuator system comprises a sawyer type motor.

29. A method of operating an electron beam apparatus according to any of clause 18 to 28, wherein the first part and/or the second part comprises a magnetic shield.

30. A method of operating an electron beam apparatus according to any of clause 18 to 29, wherein the short stroke actuator system and/or the long stroke actuator system comprises a magnetic shield.

31. A method of operating an electron beam apparatus according to any of clause 18 to 30, wherein the short stroke actuator system is configured to actuate the object table in three degrees of freedom or higher, and/or wherein the long stroke actuator system is configured to actuate the first part in two degrees of freedom or higher.

32. A method of operating an electron beam apparatus according to any of clause 18 to 31, wherein the short stroke actuator system and/or the long stroke actuator system further comprising a non-magnetic bearing.

33. A method of operating an electron beam apparatus according to clause 32, wherein the non-magnetic bearing is a passive bearing comprising a roller baring, a mechanical support foot or a gas bearing.

34. A method of operating an electron beam apparatus according to any of clause 18 to 33, wherein the electron beam apparatus comprises an E-beam direct writer, an E-beam projection lithography apparatus, an E-beam inspection apparatus, an E-beam defect verification apparatus, or an E-beam metrology apparatus.

Some embodiments of the present disclosure are beneficial especially in high resolution and/or high throughput electron beam inspection tools to detect smaller defects and more number of defects in a given time. Therefore, it is desired to position the object and the object table, by the positioning device, with a higher speed, a higher acceleration and a better accuracy while reducing disturbances by the magnetic fields produced by the positioning device to the electron beams, The object table may be actuated at the velocity of 0.01 m/s, 0.05 m/s, 0.1 m/s, 0.5 m/s, 1.0 m/s, 5 m/s or higher, at the acceleration of 1 m/s^2, 5 m/s^2, 10 m/s^2, 50 m/s^2, 100 m/s^2 or higher, and/or with the precision of 10 µm, 1000 nm, 100 nm, 10 nm, 1 nm, 0.1 nm or better.

Although the embodiments described in the specification are mainly related to an e-beam inspection tool or apparatus, the applications of this disclosure may not be limited to these particular embodiments. Some embodiments may be applied not only to the e-beam inspection tools but to any other kinds of e-beam tools such as CD-SEM, EBDW (E-Beam Direct Writer), EPL (E-beam Projection Lithography apparatus, and an E-beam defect verification apparatus, E-beam metrology apparatus, any kinds of tools with a vacuum chamber, lithography apparatus, and metrology apparatus.

Although the embodiments in the present disclosure have been explained in relation to its preferred embodiment, it is to be understood that other modifications and variation can be made without departing the spirit and scope of the disclosure as hereafter claimed.

What is claimed is:

1. An electron beam apparatus, comprising:
an e-beam source configured to generate an electron beam;
a first part configured to support a substrate, the first part comprising an object table for supporting the substrate, the first part further comprising a short stroke actuator system for actuating the object table relative to the e-beam source, the short stroke actuator system comprising a short stroke forcer;
a second part configured to movably support the first part; and
a long stroke actuator system configured to actuate movement of the first part with respect to the second part, the long stroke actuator system comprising a long stroke forcer,
wherein the short stroke forcer and/or the long stroke forcer is configured to be switched off while the electron beam is projected onto the substrate and when the object table is positioned within a range from a desired position;
wherein, when the long stroke forcer is configured to be switched off while the electron beam is projected onto the substrate and when the object table is positioned within the range from the desired position, the long stroke actuator system is configured to actuate movement of the first part with respect to the second part by exerting a non-contact force on the first part.

2. An electron beam apparatus according to claim 1, further comprising a deflection unit configured to deflect the electron beam, wherein the range is substantially equal to or smaller than a control range of the short stroke actuator system, a further control range of the deflection unit, or an even further control range being a sum of the control range and the further control range.

3. An electron beam apparatus according to claim 1, wherein the electron beam apparatus is configured to operate in leap-and-scan mode or in continuous scan mode.

4. An electron beam apparatus according to claim 1, wherein the range is 1000 µm, 100 µm, 10 µm, 1000 nm, 100 nm, or smaller.

5. An electron beam apparatus according to claim 1, wherein the object table is actuated at a velocity of 0.01 m/s, 0.05 m/s, 0.1 m/s, 0.5 m/s, 1.0 m/s, 5 m/s or higher.

6. An electron beam apparatus according to claim 1, wherein the short stroke actuator system and/or the long stroke actuator system is free of permanent magnet.

7. An electron beam apparatus according to claim 1, wherein the short stroke actuator system and/or the long stroke actuator system comprises an induction motor and/or a reluctance motor.

8. An electron beam apparatus according to claim 1, wherein the short stroke actuator system and/or the long stroke actuator system comprises a sawyer type motor.

9. An electron beam apparatus according to claim 1, wherein the first part and/or the second part comprises a magnetic shield.

10. An electron beam apparatus according to claim 1, wherein the short stroke actuator system and/or the long stroke actuator system comprises a magnetic shield.

11. An electron beam apparatus according to claim 1, wherein the short stroke actuator system is configured to actuate the object table in three degrees of freedom or higher, and/or wherein the long stroke actuator system is configured to actuate the first part in two degrees of freedom or higher.

12. An electron beam apparatus according to claim 1, wherein the short stroke actuator system and/or the long stroke actuator system further comprises a non-magnetic bearing.

13. An electron beam apparatus according to claim 12, wherein the non-magnetic bearing is a passive bearing comprising a roller baring, a mechanical support foot or a gas bearing.

14. An electron beam apparatus according to claim 1, wherein the electron beam apparatus comprises a scanning electron microscope, an E-beam direct writer, an E-beam projection lithography apparatus, an E-beam inspection apparatus, an E-beam defect verification apparatus, or an E-beam metrology apparatus.

* * * * *